United States Patent
Muterspaugh

(10) Patent No.: US 6,434,374 B1
(45) Date of Patent: *Aug. 13, 2002

(54) APPARATUS FOR CONTROLLING THE CONVERSION GAIN OF A DOWN CONVERTER

(75) Inventor: Max Ward Muterspaugh, Indianapolis, IN (US)

(73) Assignee: Thomson Licensing S.A., Boulogne (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/624,302

(22) Filed: Mar. 29, 1996

(51) Int. Cl.[7] ................................. H04B 1/06
(52) U.S. Cl. .................... 455/234.1; 455/3.02; 455/131
(58) Field of Search ............................ 455/3.1, 3.2, 4.2, 455/5.1, 6.1, 6.2, 6.3, 234.1, 234.2, 239.1, 240.1, 241.1, 249.1, 251.1, 127, 126, 130, 131, 3.02; 348/6, 10–11, 712–713, 678, 725, 731, 733, 647; 330/129, 140, 141, 52; 375/317, 319, 345, 346

(56) References Cited

U.S. PATENT DOCUMENTS

| | | | |
|---|---|---|---|
| 3,259,846 A | | 7/1966 | Elliott et al. |
| 4,158,113 A | * | 6/1979 | Lacroix .................... 330/52 |
| 4,205,269 A | * | 5/1980 | Watanabe ................ 455/232.1 |
| 4,237,490 A | | 12/1980 | Harford |
| 4,520,507 A | * | 5/1985 | Moon ...................... 348/11 |
| 4,553,105 A | * | 11/1985 | Sasaki ..................... 455/249.1 |
| 5,175,882 A | * | 12/1992 | Higashijima ............. 455/234.1 |
| 5,313,220 A | | 5/1994 | Hemmie et al. |
| 5,408,698 A | * | 4/1995 | Serizawa et al. ......... 455/246.1 |
| 5,434,537 A | * | 7/1995 | Kukkonen ................. 330/140 |
| 5,649,311 A | * | 7/1997 | Somei ...................... 455/188.1 |
| 5,659,892 A | * | 8/1997 | Soleimani et al. ......... 455/127 |

FOREIGN PATENT DOCUMENTS

CA        2000167         4/1990

OTHER PUBLICATIONS

Document entitled, Additional Comments and Summary of Duel Carrier 2–for–1 System, RCA Review, vol. 41, Sep., 1980.
European Search Report citing the above–listed reference AA.

* cited by examiner

Primary Examiner—Doris H. To
(74) Attorney, Agent, or Firm—Joseph S. Tripoli; Kuniyuki Akiyama

(57) ABSTRACT

A down converter, such as a low noise block (LNB) converter, of the outdoor unit of a terrestrial microwave or satellite receiving system includes apparatus for automatically controlling the conversion gain of the down converter. In one embodiment the automatic gain control apparatus, including a gain controllable RF stage and a gain control signal generator for generating a gain control signal in response to the output signal of the down converter, are both included within the outdoor unit. In another embodiment, the gain controllable RF stage is included in the outdoor unit, but the gain control signal generator is included in the indoor unit of the receiving system and the gain control signal is coupled to the outdoor unit in direct or in encoded form. In the latter case, the encoded gain control signal can be coupled to the down converter via the coaxial cable connected between the outdoor and indoor units. In a receiving system which processes digitally encoded information, the error rate of the information which is decoded in the indoor unit can be utilized to generate the gain control signal for the gain controllable stage of the outdoor unit.

14 Claims, 3 Drawing Sheets

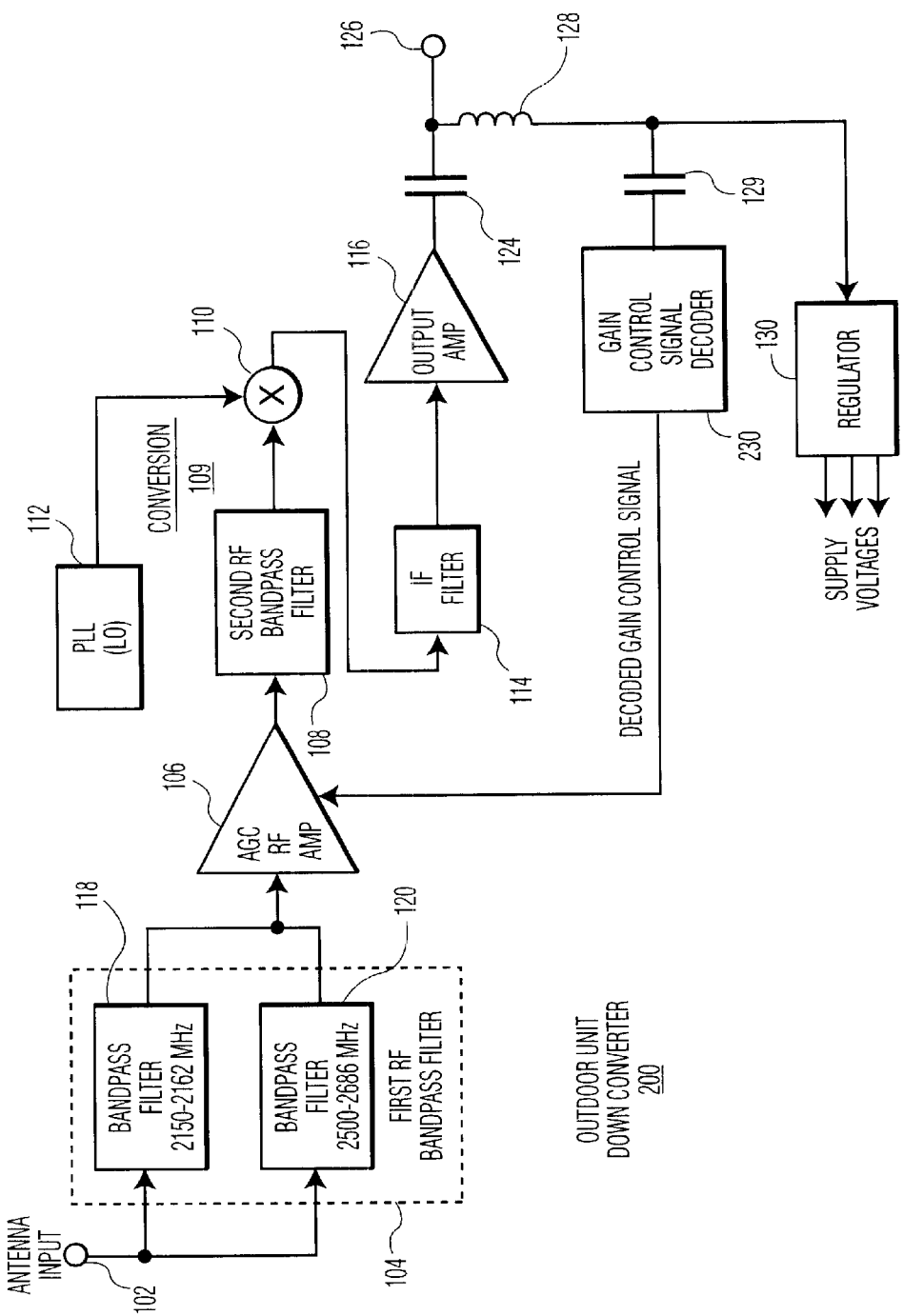
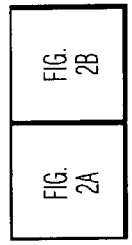
FIG. 2

APPARATUS FOR CONTROLLING THE CONVERSION GAIN OF A DOWN CONVERTER

FIELD OF THE INVENTION

The invention relates to a down converter of a communications receiver and, more particularly, to apparatus for dynamically controlling the conversion gain of a down converter.

BACKGROUND OF THE INVENTION

In a microwave distribution system for digital television signals, the television signals are transmitted on radio frequency (RF) carrier signals in the L-band microwave frequency range (e.g., 2150 to 2686 MHz). A highly directive dish-like antenna of a receiving system receives the microwave signals transmitted by the television signal transmitter. A low noise block (LNB) converter converts the entire range ("block") of relatively high frequency microwave signals transmitted by the transmitter to a more manageable lower range of frequencies (e.g., 128 to 408 MHz). This process is known as "down conversion". Typically, the LNB converter is part of an outdoor unit which includes the dish-like receiving antenna and the LNB converter. The receiving system also comprises an indoor unit. The RF signals from the outdoor unit are coupled through a coaxial cable to the indoor unit. The indoor unit includes a tuner for selecting the RF signal corresponding to a desired channel from the RF signals received from the LNB converter and for converting the selected RF signal to an even lower intermediate frequency (IF) signal. The indoor unit also includes a signal processing section for demodulating and decoding the IF signal. The RF signals produced by the LNB converter are sometimes referred to as "first IF" signals, and therefore the IF signal produced by the tuner is sometimes referred to as a "second IF" signal.

Typically, there is a single transmission site for all of the microwave signals which are received by the outdoor unit. As such, the distance from that transmission site to the receiving antenna generally determines the signal strength of all of the RF signals received by the outdoor unit. In some instances, where the receiver is relatively near to the transmitter site, the received RF signals may overload the LNB converter and the resulting distortion products may degrade the performance of the indoor unit. In a digital television transmission system, in which television information is encoded in digital form, such an overload may cause decoding errors within the signal processing section of the indoor unit. Such decoding errors are often catastrophic in that they may cause a total loss of television image and audio information.

To alleviate this problem, receiver installation technicians are instructed, when installing the system, to use a relatively low gain antenna (e.g., 20 dB gain) when the receiving location is near to a transmitter site and use a relatively high gain antenna (e.g., 24 dB gain) when the receiving location is far from the transmitter site (e.g., 30 miles or more). However, even with a low gain antenna, an overload of the LNB converter may occur. Thus, technicians are also instructed to use a LNB converter with a relatively low conversion gain for installations which are near the transmitter site. Generally, an installation technician can select one of two LNB converters having either a 20 dB or a 30 dB conversion gain.

Such an equipment selection process has been found to be error prone. For example, if the technician has incorrectly selected an antenna and LNB converter combination for a particular site, an optimal signal level, avoiding the extremes of too weak a signal and signal overload, may not be provided. Consequently, the indoor unit may produce decoding errors resulting in video and audio dropouts.

SUMMARY OF THE INVENTION

Therefore, it has been recognized by the applicant that a need exists in the art for a LNB converter containing automatic gain control (AGC) circuitry which adjusts the conversion gain of the LNB converter to compensate for variation in the received signal strength. Accordingly, the present invention concerns apparatus for dynamically controlling the conversion gain control of a down converter such as a LNB converter included in an outdoor unit.

More particularly, a low noise block (LNB) converter incorporating the invention comprises a gain controlled RF amplifier, a conversion stage including a mixer and a local oscillator, and an output amplifier, and a gain control signal generator which responds to the output signal of the output amplifier to produce a gain control signal. The gain control signal is applied to the gain controlled RF amplifier such that the gain of the amplifier is substantially constant for input signal levels above a predetermined threshold.

In one embodiment, the entire automatic gain control apparatus is totally included within the outdoor unit.

In another embodiment of the invention, portions of the gain control apparatus are partially included in the outdoor unit and partially included in the indoor unit. More specifically, the gain control signal generator is included in the indoor unit of the receiving system. The gain control signal generated by the gain control signal generator is coupled through a transmission path to the outdoor unit of the receiver system. For example, the transmission path may comprise the center conductor of the coaxial cable which connects the outdoor unit to the indoor unit. To facilitate transmitting the control signal on a single conductor such as the center conductor of the coaxial cable, an encoding apparatus is included in the indoor unit to modulate a signal carried by the single conductor with gain control information. For example, the gain control signal may be converted to a frequency modulated low frequency tone which is coupled to the center conductor of the transmission line. The center conductor is coupled to a tone decoder within the outdoor unit which regenerates the gain control signal for controlling the gain of the RF amplifier. Alternatively, the magnitude of the supply voltage for the LNB converter which is typically carried to the LNB through the center conductor of the coaxial cable may be modulated by the gain control signal.

BRIEF DESCRIPTION OF THE DRAWINGS

The teachings of the present invention can be readily understood by considering the following detailed description in conjunction with the accompanying drawings in which:

FIG. 2 depicts the appropriate alignment of FIGS. 2A and 2B;

FIGS. 2A and 2B together depict a block diagram of a communication system containing an alternative embodiment of the present invention.

In the various Figures, identical reference numerals have been used where possible to designate identical or similar elements that are common to the figures.

DETAILED DESCRIPTION

The invention will be described with reference to a terrestrial microwave digital television distribution system in which the television information is transmitted in encoded and compressed form in accordance with a pre-determined digital compression standard such as the Moving Pictures Experts Group standard (commonly known as the MPEG standard). It will be understood by those skilled in the art that other embodiments of the invention may be used in other communication systems. For example, an embodiment of the invention may be used in a digital satellite television system such as the DirecTV™ satellite television system operated by Hughes Corporation of California. In addition, while the invention is particularly useful when used in a digital communication system in which processing errors due to even a small degradation of the signal to noise performance can be catastrophic, the invention is also useful in an analog communication system to improve the signal to noise performance.

Figure 1:
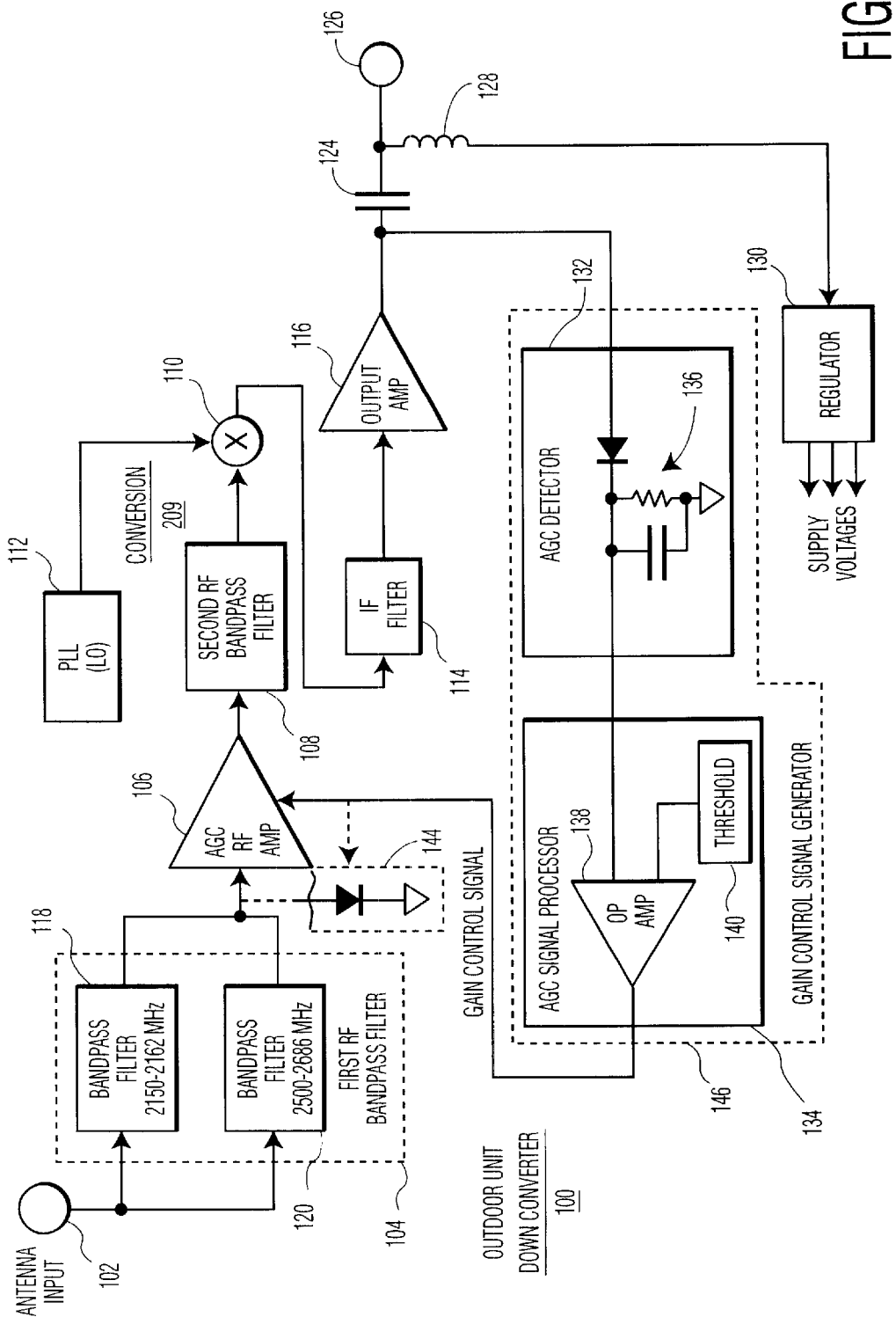
FIG. 1 depicts a block diagram of a low noise block (LNB) converter containing an embodiment of the present invention.

FIG. 1 depicts a block diagram of a low noise block (LNB) converter 100 incorporating an embodiment of the present invention as it may be employed in a terrestrial microwave digital television receiving system. The LNB converter 100 is included in the outdoor unit of the receiving system, together with a dish-like receiving antenna (not shown). The LNB converter 100 contains an input port 102 coupled to the antenna, a first RF input bandpass filter 104, a gain controlled RF amplifier 106, a second RF input bandpass filter 108, a conversion stage 109 including a mixer 110 and a local oscillator (LO) included in a phase locked loop (PLL) 112, a RF output filter 114, and a RF output amplifier 116 and a gain control signal generator 146.

The exemplary microwave digital television distribution system operates in the 2100 to 2700 MHz range including two disparate frequency bands of 2150 to 2162 MHz and 2500 to 2686 MHz. Accordingly, the first RF filter 104 comprises a pair of RF bandpass filters 118 and 120 connected in parallel between the input port 102 and the RF amplifier 106. The first RF filter 118 passes RF signals in the 2150 to 2162 MHz band and the second RF filter 120 passes RF signals in the 2500 to 2686 MHz band.

The RF amplifier 106 is used in this embodiment of the invention as an illustrative gain control device. As will be discussed below, other gain control devices may be used. The RF amplifier 106 is typically a two stage amplifier providing a maximum gain of about 15 dB. Either one or both stages of the RF amplifier is fabricated using a dual-gate GaAsFET or MOSFET transistor where, for each FET, the first gate forms an RF input terminal for the amplifier 106 and the second gate is a gain control terminal for receiving a gain control voltage. When the gain control voltage applied to the second gate is at its maximum value, the amplifier 106 has a maximum gain. As the gain control voltage applied to the second gate is decreased, the gain of the amplifier 106 decreases. Either one or both of the FETs can be used for gain control. Such an RF AGC circuit using dual-gate MOSFET is described in Trout, "Small-Signal RF Design With Dual-Gate MOSFETs", Motorola Semiconductor Product Application Note, AN-478. Other amplifier circuits such as bipolar transistor amplifiers may also be used as gain controlled amplifiers.

The output signal of the second RF bandpass filter 108 is coupled to the conversion stage 109 including the mixer 110 and the local oscillator included in the PLL 112. The mixer 110 may comprise a conventional diode mixer which has a loss of approximately 6 dB. In this embodiment the local oscillator frequency is 2278 MHz. Consequently, the mixer 110 produces low side components having RF signals in the frequency range between 116 MHz (i.e., 2278–2162 MHz) and 128 MHz (i.e., 2278–2150 MHz) and a high side component having RF signals in the frequency range between 222 MHz (i.e., 2500–2278 MHz) and 408 MHz (i.e., 2686–2278 MHz). Filter 114 has a bandpass which passes RF signals in the 116 to 402 MHz frequency range. The output signals of the filter 114, although in the RF frequency range, may be termed IF (intermediate frequency) signals, and thus, the filter 114 is labeled as an "IF Filter" in FIG. 1.

Figure 2B:
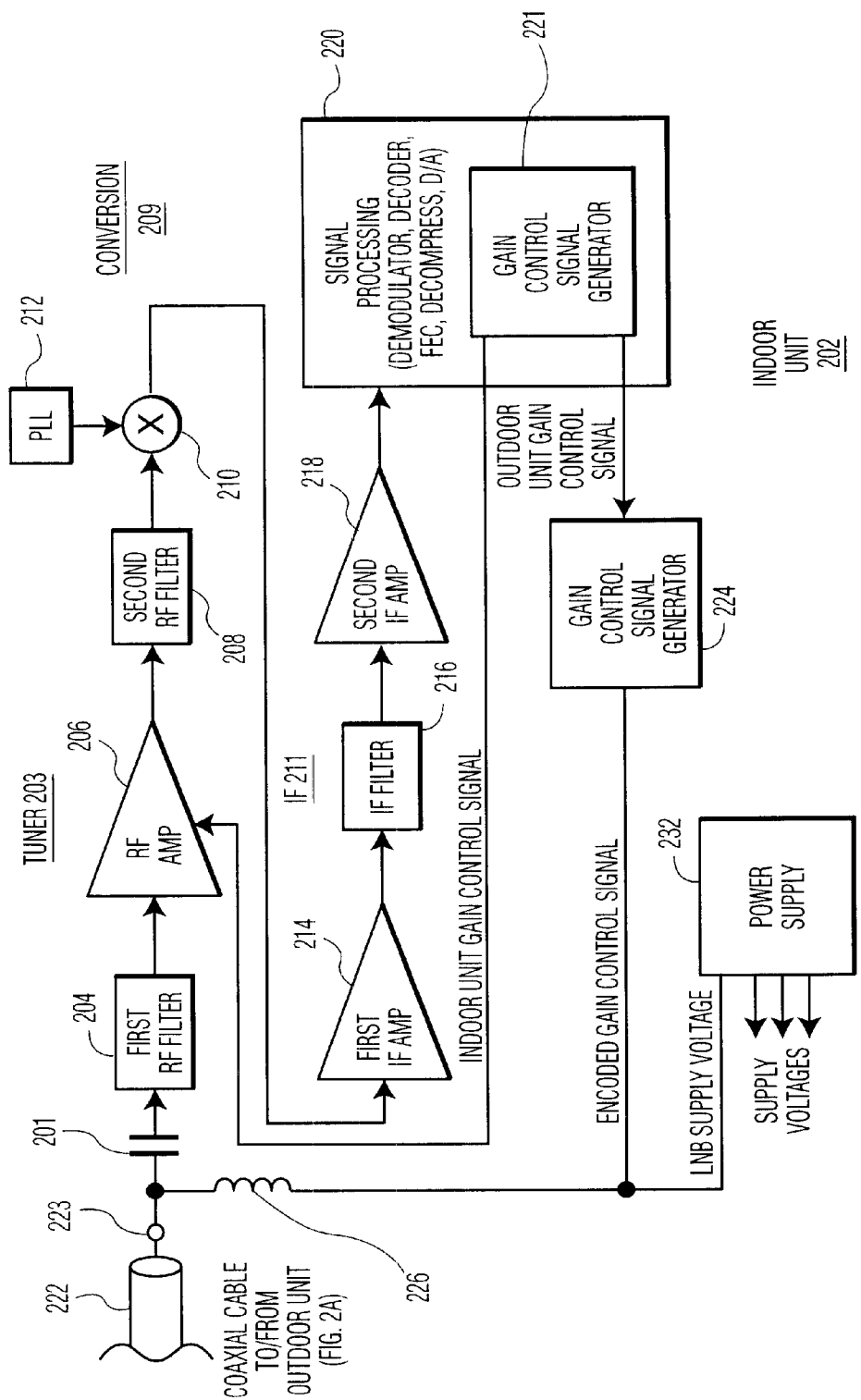

The output signals of the IF filter 114 are coupled to an output amplifier 116. The output amplifier 116 may comprise a two stage amplifier providing a total gain of approximately 20 dB. The output of the output amplifier 116 is coupled through a capacitor 124 to a RF output 126, which in turn is connected to one end of the center conductor of a coaxial cable (not shown in FIG. 1). The other end of the center conductor of the coaxial cable is connected to the RF input of the indoor unit of the receiving system (as is indicated in FIG. 2B).

Typically, the DC power for the LNB converter 100 is provided via the center conductor of the coaxial cable from the indoor unit. For this purpose, as is indicated in FIG. 1, an inductor 128 is connected via output port 126 between the center conductor of the coaxial cable to a DC voltage regulator section 130 which generates various supply voltages for the active circuits of the LNB converter 100.

An automatic gain control (AGC) signal generator 146 includes an AGC detector 132 coupled in cascade with an AGC signal processor 134. In its simplest form, the AGC detector 132 comprises a conventional diode detector 136, for example, comprising a Schottky barrier diode in combination with a resistor and capacitor load. Specifically, the diode is connected, by its anode lead, to the output of the output amplifier 116. The cathode lead of the diode is connected to the resistor and capacitor load and to the AGC signal processor 134. The detector 136 rectifies the output RF signal and applies the rectified signal to the AGC signal processor 134. The poling of the diode may be reversed if desired.

The AGC signal processor 134 in its simplest form comprises a DC amplifier, such as an operational amplifier 138. The rectified signal generated by AGC detector 132 is applied to a first input of the operational amplifier 138. A threshold voltage provided by a source 140 is applied to a second input of the operational amplifier 138. The operational amplifier 138 provides a maximum output signal until the rectified signal RF output signal exceeds the threshold voltage. At that point, the output signal of the operational amplifier will be decreased as the rectified signal increases. The output signal of the operational amplifier 138 is the gain control signal provided to the RF amplifier 106. In this manner, after the rectified signal has exceeded the threshold voltage, as the rectified signal increases in magnitude, the gain control signal decreases in magnitude.

As described above, in the embodiment described so far, the gain control signal is applied to one gate of a dual-gate GaAsFET or MOSFET to control the overall conversion gain of the LNB converter 100. As an alternative gain control device, a PIN diode attenuator 144 can be positioned between the first RF filter 104 and the RF amplifier 106. The RF amplifier 106 in this case would have a fixed gain and the attenuation of the PIN diode attenuator would be controlled by the gain control signal. As such, a decrease in the magnitude of the gain control signal would increase the attenuation of the input signal to the RF amplifier 106. Of course, the relationship between the gain control signal magnitude and the attenuation value may vary depending upon the specific circuit arrangement which is used to implement the invention. For example, the operational amplifier may produce a control signal that increases with increasing output signal strength and, as such, the attenuation would increase with increase of the gain control signal.

The gain control may also be provided in discrete gain control steps. For example, an attenuator can be "switched-in" or "switched-out" of the signal path between the first RF filter 104 and the RF amplifier 106 in response to the gain control signal. When the detected output signal is larger than the voltage threshold, the gain control signal would cause the attenuator to be "switched-out". When the output signal is below the voltage threshold, the attenuator would not be "switched-in". More than one gain control step can be provided with the addition of more attenuators.

In the embodiment of the invention described with respect to FIG. 1, the automatic gain control provisions were completely contained within the outdoor unit. In the embodiment of the invention depicted in FIGS. 2A and 2B, part of the gain control circuitry is included in the outdoor unit and part is included in the indoor unit. More specifically, the gain controllable stage remains in the down converter of the outdoor unit, but the gain control signal generator is included in the indoor unit and is coupled back to the down converter of the outdoor unit.

FIG. 2 depicts the appropriate alignment of FIGS. 2A and 2B. FIGS. 2A and 2B together depict the embodiment of the invention in which portions of the automatic gain control arrangement are incorporated both in the outdoor unit 200 shown in FIG. 2A and in the indoor unit 202 shown in FIG. 2B. The outdoor unit depicted in FIG. 2A is similar to that in FIG. 1; therefore, only the differences are discussed below.

The indoor unit 202 shown in FIG. 2B comprises a tuner including a first RF filter 204, a RF amplifier 206, a second RF filter 208 and a conversion stage 209 including a mixer 210 and a local oscillator included in a phase locked loop (PLL) 212. The RF output signals, which are received from the outdoor unit 200 via the coaxial cable at an RF input 223, are coupled through a capacitor 201 to the tuner 203. The two RF filters 204 and 208 and the RF amplifier 206 filter and amplify the received RF signals. The local oscillator signal received by mixer 210 from the phase lock loop 212 has a frequency which is controlled by a microprocessor (not shown) to select the particular RF signal corresponding to the desired channel from the "block" of RF signals received from the outdoor unit 200.

The indoor unit 202 also includes an IF amplifier 214, a first IF filter 216 and a second IF amplifier 218. The IF signal produced by mixer 210 is amplified and filtered and then amplified again by the IF amplifier 214, IF filter 216 and IF amplifier 218. The IF signal processed by IF amplifier 214, IF filter 216 and IF amplifier 218 may be called a "second IF signal" because the RF output signals of outdoor unit 200 may be called "first IF" signals. By way of example, the second IF signal can have a frequency in the range of 44 MHz.

The processed "second" IF signal is coupled to a signal processing section 220 which demodulates, decodes and decompresses the digital television information to produce digital signals representing video and audio information. Signal processing section 220 also converts the digital signals into a corresponding analog signal suitable for displaying a television image and producing a corresponding audible response.

A power supply unit 232 generates supply voltages for various sections of indoor unit 202. In addition, power supply 232 generates a supply voltage for the LNB converter of outdoor unit 200. Typically, as is shown in FIG. 2B, the LNB supply voltage is coupled to the LNB converter of outdoor unit 200 via the center conductor of the coaxial cable 222 connected between RF output port 126 of the LNB converter 200 and of the input port 223 of the indoor unit 202. The capacitor 201 prevents the LNB supply voltage from being coupled to the input of the tuner 203, and inductor 226 prevents the RF input signals from being coupled to power supply 232.

A gain control signal generator 221 of signal processing section 220 responds to the magnitude of the demodulated signal to generate a gain control signal. More specifically, the demodulator portion of signal processing section 220 produces pulse signals corresponding to the digitally encoded television information. Gain control signal generator 221 generates a signal representing the magnitude of the pulse signals. The magnitude representative signal is compared to a threshold and generates a gain control signal which has a magnitude related to the magnitude of the pulse signals when the threshold is exceeded. This process may take place in analog or digital form. Alternatively, the outdoor unit gain control signal can be generated in response to the magnitude of the second IF signal. In addition, the gain control signal generator for the LNB converter of the outdoor unit 200 may share portions of signal processing section 220 used to generate a gain control signal for the RF amplifier 204 of the indoor unit 202, as is indicated in FIG. 2B.

The gain control signal can also be derived in response to errors produced by the digital signal decoder within the signal processor 220. More specifically, the decoder includes error correction provisions such as a forward error correcting (FEC) section operating, for example, according to the well known Reed-Solomon algorithm. Gain control signal generator 221 can monitor the bit error rate detected by the FEC section of the decoder and can adjust the gain control signal to change the conversion gain of the down converter to reduce the error rate. For example, when the error rate becomes unacceptable, the gain control signal may be changed to increase the gain of the RF amplifier 106 in the LNB converter 200 by a predetermined amount. If the error rate improves, the gain of the RF amplifier 106 is caused to again increase by the predetermined amount. This process is repeated until the error rate no longer improves. Conversely, if upon the first or any subsequent gain increase, the bit error rate worsens, the gain of the RF amplifier 106 is caused to repeatedly decrease in steps until the error rate stabilizes.

The outdoor gain control signal generated by gain control signal generator 221 is coupled to a gain control signal encoder 224. The gain control signal encoder 224 encodes the gain control signal and couples the coded signal to a transmission path that carries the coded signal to the outdoor unit 200. Advantageously, the transmission path is the center conductor of the coaxial cable 222 connected between the indoor unit 202 and the outdoor unit 200. For example, the control signal encoder 224 can convert the gain control signal into a relatively low frequency tone, such as an audio frequency tone, having a frequency dependent on the magnitude of the gain control signal. A voltage controlled oscillator may be used for this purpose. The gain control signal for the outdoor unit 200 can be encoded using other encoding techniques, such as pulse width modulation, amplitude modulation and the like. The encoded gain control signal is coupled via a low pass filter, comprising the inductor 226 (which is already used to isolate power supply 232 from the RF input signals), to the center conductor of the coaxial cable 222.

As shown in FIG. 2A, in the outdoor unit 200, a decoder 230 is coupled through the inductor 128 and a capacitor 129 to the center-conductor of the coaxial cable for decoding the encoded gain control signal. In the case of a tone signal having a frequency modulated in accordance with the magnitude of the gain control, decoder 230 may comprise a frequency discriminator. The output of the decoder 230 is a DC voltage corresponding to the gain control signal which was generated within the indoor unit 202. The decoded gain control signal is applied to the gain controllable stage, such as RF amplifier 106, of the outdoor unit 200. As described with reference to FIG. 1, the gain controllable stage can comprise a gain controllable amplifier, such as a GaAsFET, MOSFET or bipolar transistor amplifier, or a controllable attenuator.

The gain control signal for LNB converter 200 does not necessarily have to be encoded. The gain control signal can be applied to the center conductor without encoding if the center conductor is not used to supply power to the outdoor unit. In addition, depending on the power supply noise specification of the LNB converter 200, the gain control signal can be superimposed on the LNB power supply voltage to modulate its level. If the gain control signal modulation of the LNB supply voltage is kept at a reasonably low level, the supply voltages produced by regulator 130 in the LNB converter 200 will not change in response to the gain control signal. However, the gain control signal modulation can be detected by the decoder and converted to the gain control signal for the controllable gain control stage.

Rather than coupling the gain control signal from the indoor unit 202 to the LNB converter 200 via the coaxial cable 222, a separate path, for example comprising a twisted pair of conductors, can be used.

One or more of the following advantages result from the automatic gain control provisions of the down converter arrangements which have been described:

The amplitudes of the RF output signals are maintained at a relatively constant level, although the amplitude of the RF input signals supplied by the antenna may vary significantly.

The signal to noise performance is improved.

High level received RF signals are not distorted by the down conversion process. In a digital receiving system this minimizes video and audio dropouts due to decoding errors.

The amplitude variations due to the well known phenomenon of microwave fading is reduced.

The criticality of installation procedures is reduced.

Another use of the gain control signal for the outdoor unit is to optimally position the antenna during installation. The gain control signal may be used to indicate signal strength to an installer either visually, such as by means of a meter, or aurally, such as by means of an audio tone generator which generates an audio response which changes frequency or amplitude as the signal strength changes. The embodiment shown in FIG. 1, in which a gain control signal is generated within the LNB converter 100, is particularly useful in this regard in that signal strength indication device can be coupled directly to gain control signal generator 146 of the outdoor unit, where the antenna alignment is taking place.

Although various embodiments and modifications which incorporate the teachings of the present invention have been described in detail, those skilled in the art can readily devise many other embodiments which still incorporate these teachings and fall within the scope of the invention defined by one or more of the following claims.

What is claimed is:

1. Apparatus comprising:
   an outdoor unit of a receiving system for receiving a plurality of radio frequency (RF) signals, a level of said plurality of RF signals received by said outdoor unit at a receiving location staying substantially unchanged;
   a first converting stage in said outdoor unit for converting said plurality of RF signals in a first band of frequencies, which signals correspond to a respective plurality of RF channels, as a block to a corresponding plurality of first intermediate frequency (IF) signals in a second band of frequencies;
   said first converting stage being gain controllable and having a gain control input;
   said first converting stage developing at an output said plurality of first IF signals for providing said plurality of first IF signals for a second converting stage in an indoor unit;
   said second converting stage selecting one of said plurality of first IF signals which corresponds to one of said plurality of RF channels to produce a second IF signal; and
   control means entirely within said outdoor unit coupled between said gain control input and said output for controlling the gain of said first converting stage in response to a level of said plurality of first IF signals and thus in response to said corresponding plurality of substantially unchanged RF signals received by said outdoor unit at said receiving location.

2. The apparatus of claim 1 wherein
   said control means is responsive to the peak value of said plurality of first IF signals as a block.

3. The apparatus of claim 1 wherein
   said control means is responsive to the average value of said plurality of first IF signals in said second band of frequencies as a block.

4. The apparatus of claim 1 wherein
   said first converting stage comprises a gain controllable amplifier.

5. The apparatus of claim 1 wherein
   said first converting stare comprises a controllable attenuator.

6. A down converter in an outdoor unit comprising:
   an input point for providing a plurality of RF signals received by said outdoor unit, said plurality of RF signals corresponding to a respective plurality of RF channels in a first band of frequencies, a level of said plurality of RF signals at a receiving location staying substantially unchanged;
   a first converter within said outdoor unit including a mixer for converting said plurality of RF signals in said first band of frequencies as a block to a corresponding plurality of first intermediate frequency (IF) signals in a second band of frequencies;
   said first converter including means for changing the magnitude of said plurality of RF signals in response to a control signal, said means having a control input;
   said first converter developing at an output said plurality of first IF signals for providing said plurality of first IF signals for a second converter in an indoor unit;
   said second converter selecting one of said plurality of first IF signals which corresponds to one of said plurality of RF channels to produce a second IF signal; and control means coupled between said control input and said output for generating said control signal in response to a level of said plurality of first IF signals as a block and thus in response to said corresponding plurality of substantially unchanged RF signals received by said outdoor unit at said receiving location.

7. The down converter of claim 6 wherein said means for generating said control signal generates said control signal when a signal representing a characteristic of said plurality of first IF signals in said second band of frequencies as a block exceeds a threshold.

8. The down converter of claim 7 wherein said characteristic corresponds to the peak value of the magnitude of said plurality of first IF signals in said second band of frequencies as a block.

9. The down converter of claim 7 wherein said characteristic corresponds to the average value of the magnitude of said plurality of first IF signals in said second band of frequencies as a block.

10. The down converter of claim 6 wherein said means for changing the magnitude of said plurality of RF signals comprises a gain controllable amplifier.

11. The down converter of claim 6 wherein said means for changing the magnitude of said plurality of RF signals comprises a controllable attenuator.

12. A down converter of a microwave receiving system comprising:

an antenna input point;

a first bandpass filter coupled to said antenna input point for providing a plurality of first filtered RF signals which correspond to a respective plurality of RF channels, a level of said plurality of first filtered RF signals staying substantially unchanged at a receiving location;

control means coupled to said first bandpass filter for controlling the magnitude of said plurality of first filtered RF signals in response to a control signal; said control means having a control input for receiving said control signal;

a second bandpass filter coupled to said first bandpass filter for providing a plurality of twice filtered RF signals;

a local oscillator for generating a local oscillator signal;

a mixer coupled to said second bandpass filter and said local oscillator for generating a plurality of first intermediate frequency (IF) signals which correspond to said plurality of twice filtered RF signals;

an IF filter coupled to said mixer for providing a plurality of filtered first IF signals;

an IF amplifier couple to said IF filter for amplifying said plurality of filtered first IF signals to produce a plurality of output signals;

a down converter output point coupled to said IF amplifier for coupling said plurality of output signals to an indoor unit via a coaxial cable;

said indoor unit including a converter;

said converter selecting one of said plurality of output signals which corresponds to one of said plurality of RF channels to produce a second IF signal;

a detector coupled to said IF amplifier for generating a signal representing the peak value of the magnitude of said plurality of output signals as a block;

means coupled between an output of said detector and said control input of said control means for controlling the magnitude of said control signal when said signal representing said peak value of the magnitude of said plurality of output signals as a block exceeds a threshold block said means generating said control signal in response to said corresponding plurality of substantially unchanged RF signals received by said outdoor unit at said receiving location; and said down converter being within an outdoor unit.

13. The down converter of claim 12 wherein said control means comprises a gain controllable amplifier.

14. The down converter of claim 12 wherein said control means comprises a controllable attenuator.

* * * * *